United States Patent
Yu et al.

(10) Patent No.: US 6,674,622 B1
(45) Date of Patent: Jan. 6, 2004

(54) DYNAMIC FLOATING SCR (SEMICONDUCTOR-CONTROLLED-RECTIFIER) ESD PROTECTION

(75) Inventors: Ta-Lee Yu, Hsinchu (TW); Jian-Hsing Lee, Hsi-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 116 days.

(21) Appl. No.: 10/037,579

(22) Filed: Jan. 4, 2002

(51) Int. Cl.$^7$ .................................. H02H 3/22
(52) U.S. Cl. ................... 361/56; 361/111; 361/91.1; 361/127
(58) Field of Search ............... 361/56, 111, 91.1, 361/127

(56) References Cited

U.S. PATENT DOCUMENTS

| | | | |
|---|---|---|---|
| 5,400,202 A | | 3/1995 | Metz et al. .................... 361/56 |
| 5,465,189 A | * | 11/1995 | Polgreen et al. ............... 361/58 |
| 5,945,714 A | * | 8/1999 | Yu .............................. 257/355 |
| 5,949,634 A | * | 9/1999 | Yu .............................. 361/111 |
| 5,959,821 A | | 9/1999 | Voogel ........................ 361/111 |
| 5,962,876 A | * | 10/1999 | Yu .............................. 257/133 |
| 6,011,420 A | | 1/2000 | Watt et al. .................... 327/310 |
| 6,137,339 A | * | 10/2000 | Kibar et al. ................. 327/333 |
| 6,399,990 B1 | * | 6/2002 | Brennan et al. ............. 257/355 |
| 6,433,979 B1 | * | 8/2002 | Yu ................................ 361/56 |

* cited by examiner

Primary Examiner—Bao Vu
(74) Attorney, Agent, or Firm—George O. Saile; Stephen B. Ackerman

(57) ABSTRACT

This invention provides a circuit and a method for protecting electronic circuits from electrostatic damage ESD. The invention teaches a dynamic floating silicon-controlled rectifier SCR for use as an ESD clamp. The n-well of the SCR is biased to the supply voltage Vdd under normal conditions to provide good latch-up performance. During ESD events, the n-well is floated to improve clamping performance. In addition, this invention utilizes a floating-well control circuit which provides better latch-up immunity during normal operation after the ESD event has passed.

27 Claims, 6 Drawing Sheets

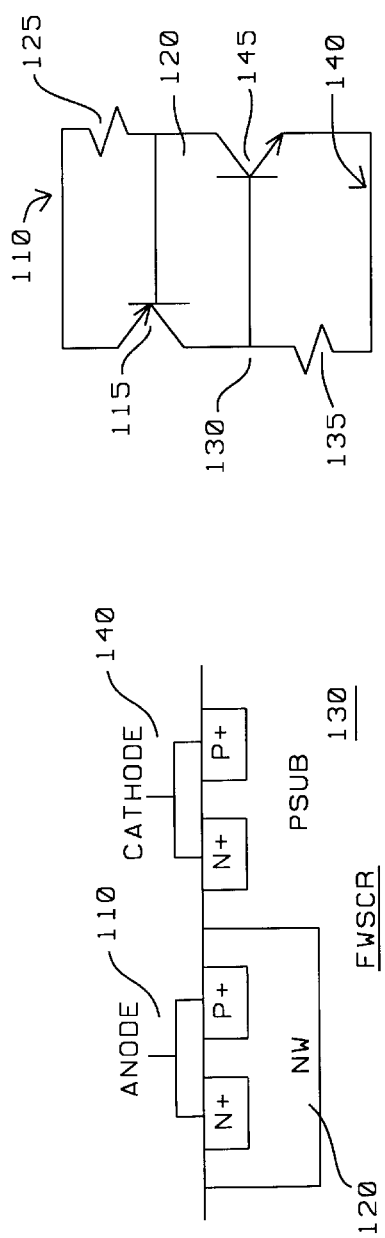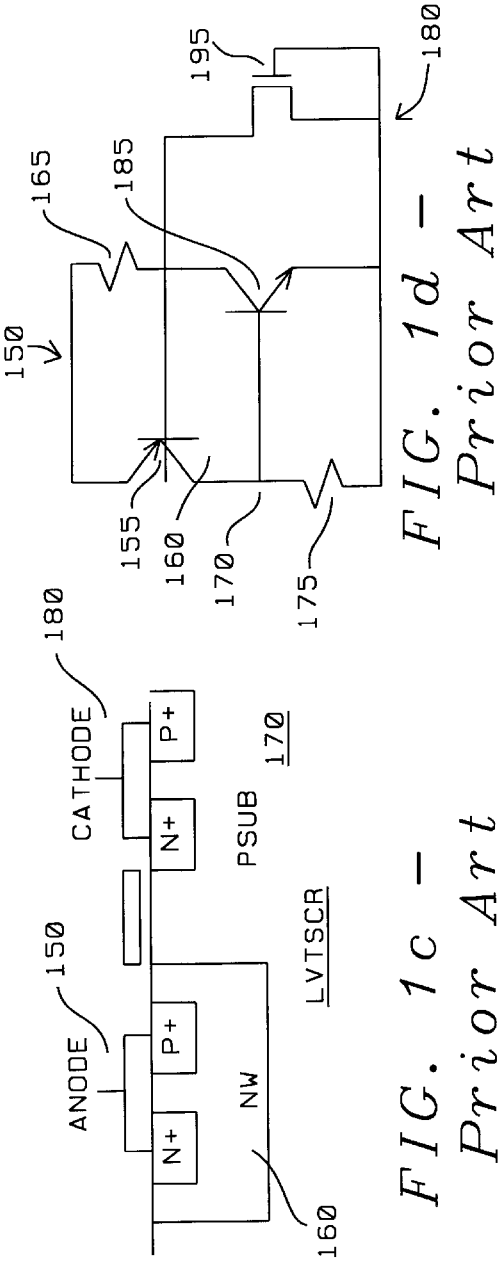

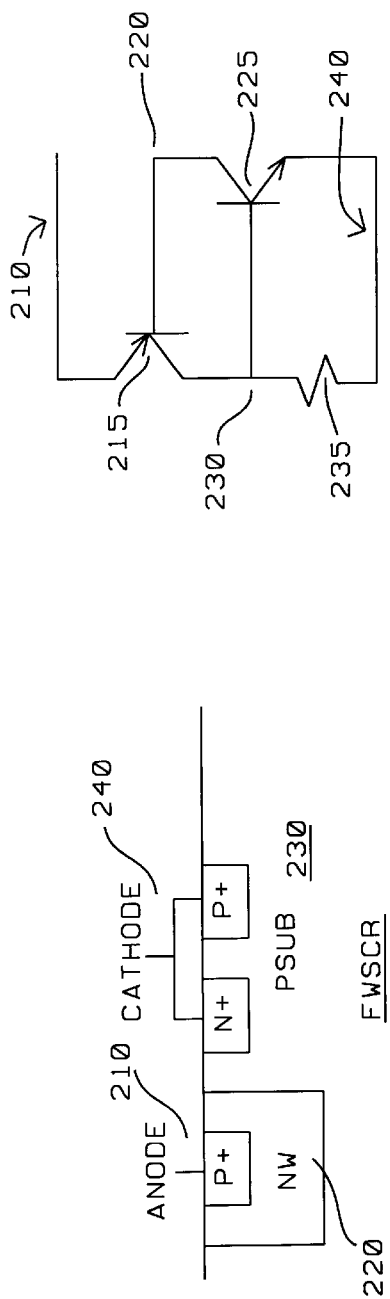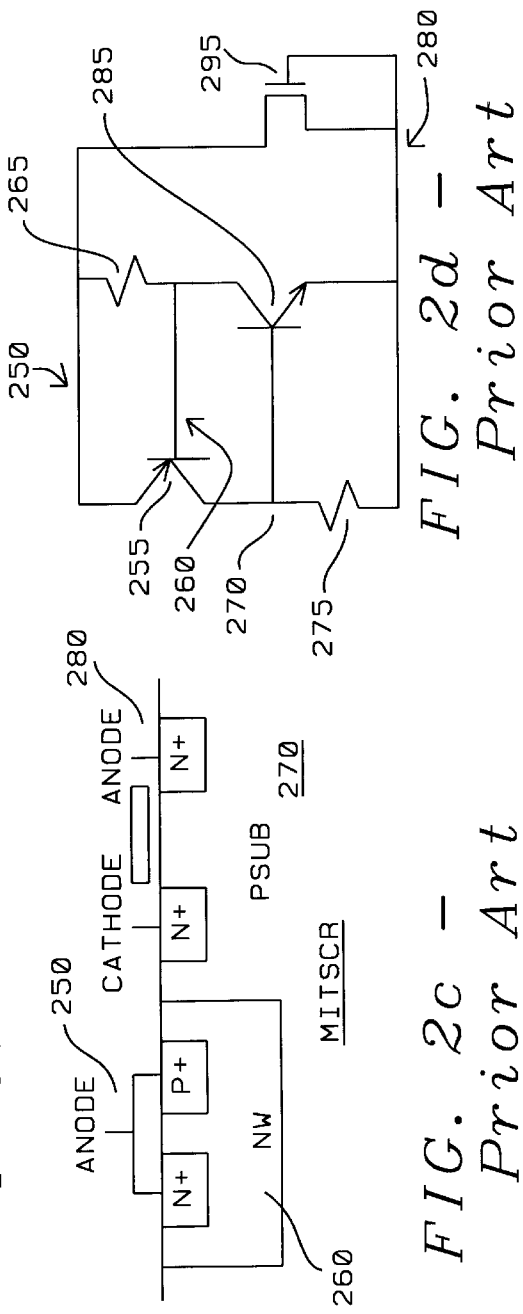
FIG. 2a - Prior Art
FIG. 2b - Prior Art
FIG. 2c - Prior Art
FIG. 2d - Prior Art

DYNAMIC FLOATING SCR (SEMICONDUCTOR-CONTROLLED-RECTIFIER) ESD PROTECTION

BACKGROUND OF THE INVENTION

1. Field of the Invention

This invention relates to a circuit and a method for protecting circuits from electrostatic discharge ESD. More particularly this invention relates to a circuit and a method which utilizes a dynamic floating circuit in conjunction with a silicon-controlled rectifier SCR in order to provide ESD protection for electronic circuits.

2. DESCRIPTION OF RELATED ART

Today, conventional electrostatic protection circuits utilize capacitors and silicon-controlled-rectifiers SCRs. FIGS. 1a and 1b show a lateral SCR (LSCR) ESD structure. This is the most basic SCR structure. In FIG. 1a, the SCR is imade up of P-N-P-N structure. The circuit model in fig. 1b shows the anode 110 attached to a PNP transitor 115 and a resistor 125. FIG. 1b further shows an NPN transistor 145 and another resistor 135 attached to the cathode of the SCR 140.

FIGS. 1c and 1d show a low-voltage trigger SCR (LVTSCR) ESD structure. This structure is described in U.S. Pat. No. 5,465,189. This structure is popular due to the low-voltage trigger. In FIG. 1c, the SCR is made up of P-N-P-N structure. The circuit model in FIG. 1d shows the anode 150 attached to a PNP transitor 155 and a resistor 165. FIG. 1d further shows an NPN transistor 185 and another resistor 175 attached to the cathode of the SCR 180. In addition, an FET trigger device 195 is shown in FIG. 1d.

FIGS. 2a and 2b show a floating-well SCR (FWSCR) ESD structure. This structure is exhibited in U.S. Pat. 5,945,714. In FIG. 2a, the SCR is made up of P-N-P-N structure. The circuit model in FIG. 2b shows the anode 210 attached to a PNP transitor 215. FIG. 2b further shows an NPN transistor 245 and another resistor 235 attached to the cathode of the SCR 240.

FIGS. 2c and 2d show a MOS-incorporated-triggering SCR (MITSCR) ESD structure. This structure is exhibited in U.S. Pat. No. 5,986,307. In FIG. 2c, the SCR is made up of P-N-P-N structure. The circuit model in FIG. 2d shows the anode 210 attached to a PNP transitor 215 and a resistor 225. FIG. 2d further shows an NPN transistor 245 and another resistor 235 attached to the cathode of the SCR 240.

U.S. Pat. No. 6,011,420 (Watt, et al.) "ESD Protection Apparatus Having Floating ESD Bus and Semiconductor Structure" discloses an ESD protection scheme where a single ESD protection structure is connected to multiple pads. The circuit uses an FET-triggered SCR.

U.S. Pat. No. 5,959,821 (Voogel) "Triple-Well Silicon Controlled Rectifier with Dynamic Holding Voltage" describes a triple-well SCR with a circuit to control the voltage of the p-well. The triple-well structure is used for isolation from ground and to allow insertion of a control circuit for controlling the holding voltage of the SCR.

U.S. Pat. No. 5,400,202 (Metz, et al.) "Electrostatic Discharge Protection Circuit for Integrated Circuits" discloses an FET-triggered SCR to provide ESD protection for circuits. A trigger circuit which is activated by an ESD event triggers SCR latch-up.

BRIEF SUMMARY OF THE INVENTION

It is the objective of this invention to provide a circuit and a method to protect electronic circuits from electrostatic discharge ESD damage.

It is further an object of this invention to provide this ESD circuit protection by using a control circuit and a silicon-controlled rectifier SCR to dynamically isolate the electronic circuits during ESD events.

In addition, it is further the object of this invention to place the control circuit between the supply voltage and the SCR in order provide better immunity from permanent SCR latch-up during the return to normal operation after an electrostatic event.

The objects of this invention are achieved by a circuit which includes a floating-well circuit connected between the supply voltage Vdd and the N-well of a silicon-controlled rectifier, (SCR). In addition, the floating-well circuit contains a transistor switch which is turned on during normal operation effectively connecting the N-well of the SCR to the supply voltage (Vdd). Alternatively, the transistor switch is turned on to allow the SCR to provide isolation from ground and circuit protection during ESD events. This transistor control circuit also provides latch-up immunity by incorporating a discharge resistor which allows the SCR to revert back to its non-latched state after the occurrence of an electrostatic event.

The objects of this invention are achieved by a method of designing ESD protection circuits which provides for the connection of a floating-well circuit between the power supply voltage VCC and the N-well of an SCR. This method of protecting circuits from ESD damage also provides for the switching of a field effect transistor FET On during normal operation to effectively connect the N-well of the SCR to the supply voltage VCC. The circuit design method includes a capacitor attached from the supply voltage Vdd to the gate of the FET. During electrostatic events where the supply voltage contains spikes which momentarily increase the supply voltage beyond Vdd, the capacitor charges. The charging of this capacitor causes the FET switching transistor to turn Off. The switching Off of an FET during ESD events makes the SCR change into a FWSCR (floating-well SCR) to provide better ESD performance. However, in normal operation, the FET will be turned On so that the N-well will be reconnected to Vdd. Thus, the invention becomes a conventional SCR (Not FWSCR) to provide better latch-up immunity during normal operation. In addition, the method of designing ESD protection circuits provides latch-up immunity for the SCR by including a discharge resistor attached to the said capacitor. Once the ESD event has passed, the above capacitor discharges through the resistor during a pre-designed time constant. This allows the SCR to return to its non-latched state and allows the FET transistor to switch back On, effectively reconnecting the SCR to the supply voltage Vdd. Therefore, this method prevents the protection circuit from remaining in an SCR latched up state after the occurrence of an ESD event. This is what is known as latch-up immunity.

BRIEF DESCRIPTION OF THE DRAWINGS

FIG. 1a shows prior art lateral (LSCR) SCR ESD CMOS cross-section.

FIG. 1b shows prior art lateral (LSCR) SCR ESD protection circuit.

FIG. 1c shows prior art voltage trigger (LVTSCR) SCR ESD CMOS cross-section.

FIG. 1d shows prior art voltage trigger (LVTRSCR) SCR ESD protection circuit.

FIG. 2a shows prior art floating well (FWSCR) SCR ESD CMOS cross-section.

FIG. 2b shows prior art floating well (FWSCR) SCR ESD protection circuit.

FIG. 2c shows prior art MOS incorporated triggering (MIT-SCR) SCR ESD CMOS cross-section.

FIG. 2d shows prior art MOS incorporated triggering (MIT-SCR) SCR ESD protection circuit.

DETAILED DESCRIPTION OF THE INVENTION

Figure 3A:
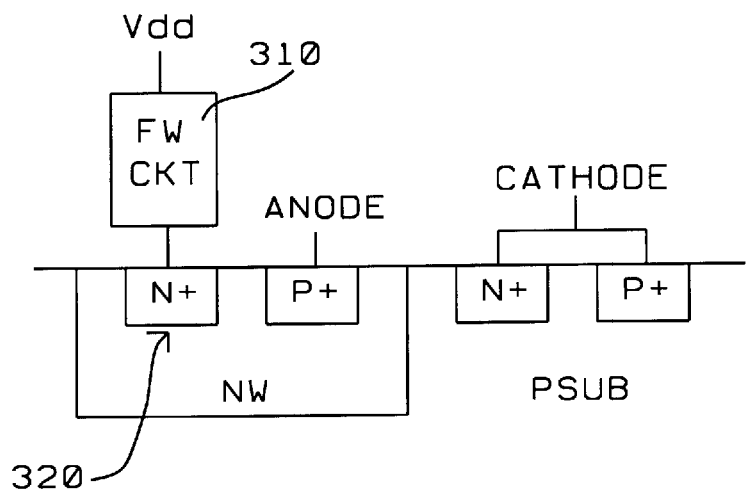
FIG. 3a shows the CMOS structure of the floating well circuit of the invention.
Figure 3B:
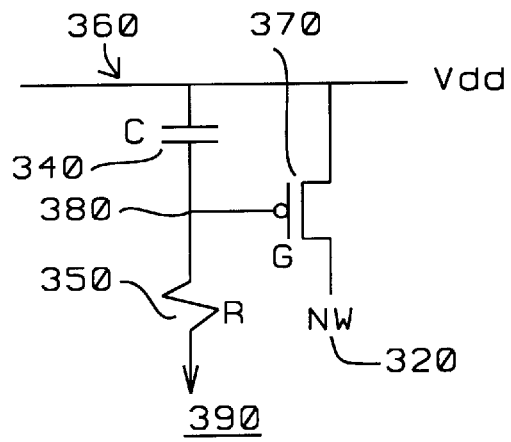
FIG. 3b shows the circuit diagram of the floating well structure of the invention.

FIG. 3a shows a cross-section of a CMOS SCR circuit (PNPN). The embodiment of this invention shown by the floating-well (FW) circuit 310 placed between the supply voltage Vdd and the N well 320 of the SCR. FIG. 3b shows a schematic of one embodiment of the FW circuit.

The supply voltage Vdd is now attached to FW node 360 instead of to the N+N well of the SCR. A capacitor 340 is connected between the Vdd node 360 and node 380. A resistor 350 is connected between node 380 and 390 that is ground. A p-channel metal-oxide semiconductor field effect transistor (MOSFET) 370 has its drain connected to Vdd 360, its source connected to 320 in FIG. 3b, the N-well of the SCR and its gate connected to 380. During normal operation without electrostatic discharge ESD events, FET 370 is ON and the N-well of the SCR 320 is at the Vdd voltage level. With this voltage level, the SCR is OFF and the electronic circuits on the same semiconductor dye operate normally. The well-connected SCR will provide better latch-up immunity. That is, the SCR should not be turned ON.

When there is an ESD event, the capacitor 340 in FIG. 3b charges up due to the ESD voltage spike. This capacitive charge causes FET 370 to turn OFF. This causes the voltage at node 320 at the N-well to increase effectively latching up the SCR in its low impedance ON stateThis low impedance SCR state will conduct or bypass ESD current effectively so that it will provide better ESD performance during ESD events.

The R 350 and C 340 in FIG. 3b form a time constant RC which cane be specified to allow the charge on C 340 to discharge as a function of the RC time constant. After C discharge, the p-charged FET turns back on to allow Vdd voltage level to reach the N-well 320 once again. The RC discharge part of the FW circuit of FIG. 3b is an important feature of this invention. It allows the ESD protection circuit to have latch-up immunity.

Figure 3C:
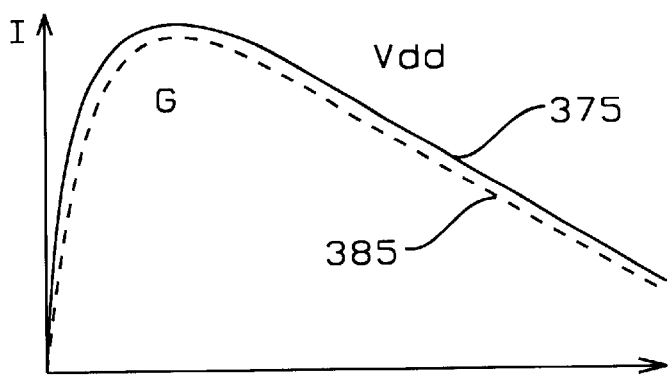
FIG. 3c shows the current-time graph during HBM-ESD pulse of the circuit given in FIG. 3b.

FIG. 3c illustrates voltage vs. time. The voltages shown are the voltage at the gate of the FET 370 in FIG. 3b and the supply voltage Vdd. The solid line 375 is the HBM-ESD waveform. The dashed line 385 is the current waveform at node G 370 in FIG. 3b.

Figure 4A:
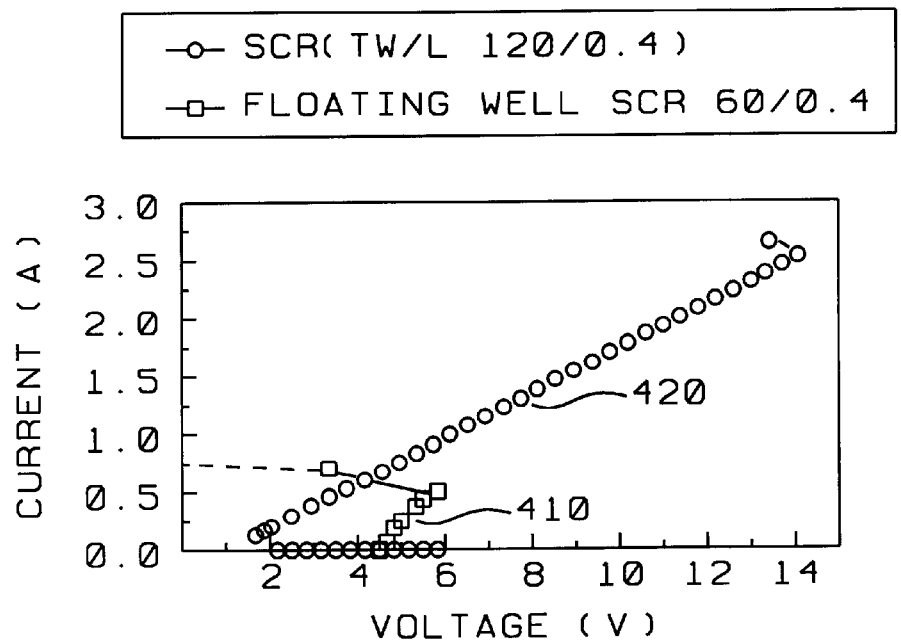
FIG. 4a shows the current-voltage characteristic of the SCR of the invention.

FIG. 4a shows laboratory results of current vs. voltage for an SCR 410 and for a floating-well SCR (FWSCR) 420. The data plotted with squares 410 shows a well-connected SCR. This SCR data shows poor ESD performance (It=0.75 A). The data plotted with circles 420 shows a floating-well SCR. This SCR data shows the better ESD performance of the floating-well SCR (It=2.5 A).

Figure 4B:
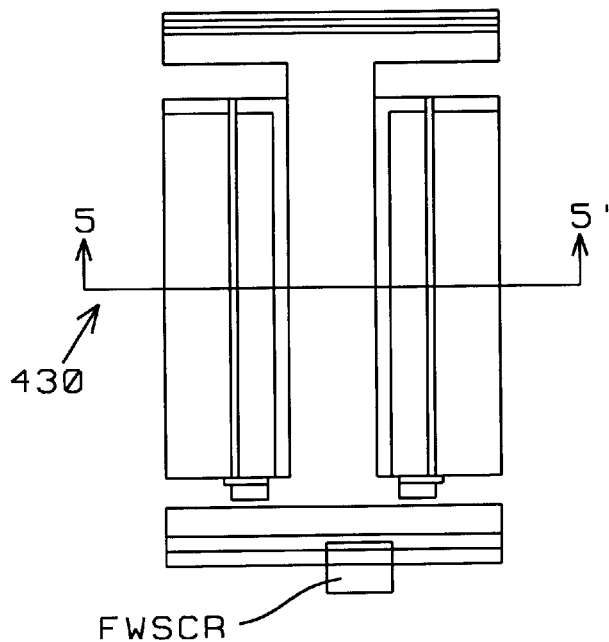
FIG. 4b shows the integrated circuit layout of the circuit of the invention.

FIG. 4b shows a top view of the layout of an NMOS+FWSCR circuit. The cross-section line 430 is a point of reference for the semiconductor side view given in FIG. 5.

Figure 5:
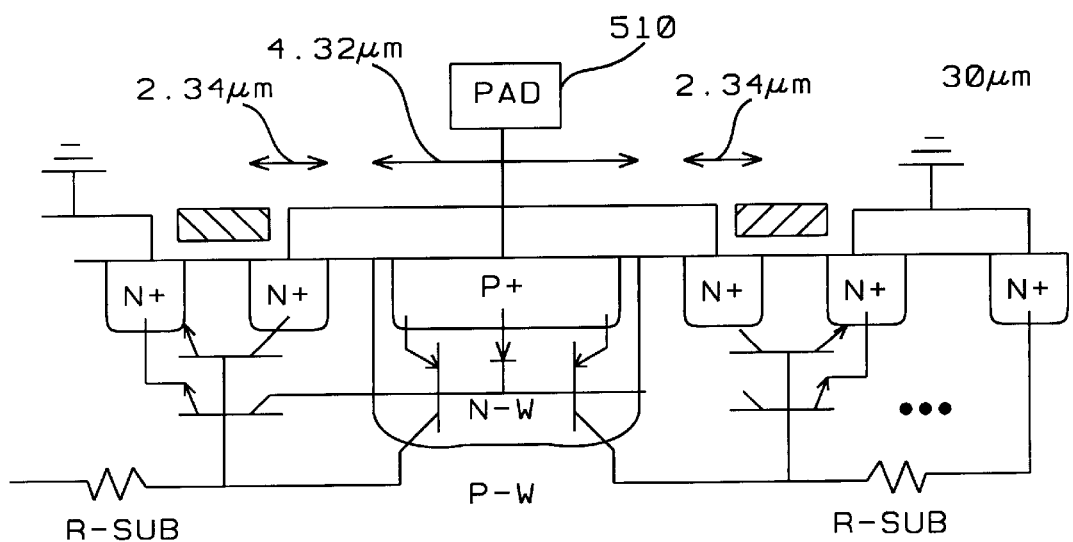
FIG. 5 shows the CMOS cross-section of the circuit layout of FIG. 4b.
Figure 6A:
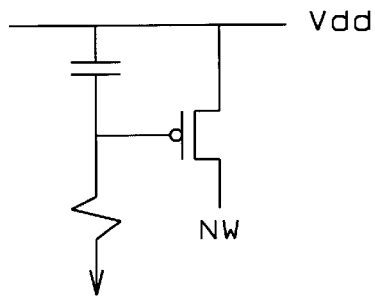
FIG. 6a shows floating well invention variation #1.

FIG. 5 shows a typical input/output semiconductor pad 510. FIG. 6a shows the same floating-well SCR (FWSCR) circuit block as the one given in FIG. 3b. This is the first embodiment of the FWSCR of this invention. This first embodiment is described above in the description of FIG. 3.

Figure 6B:
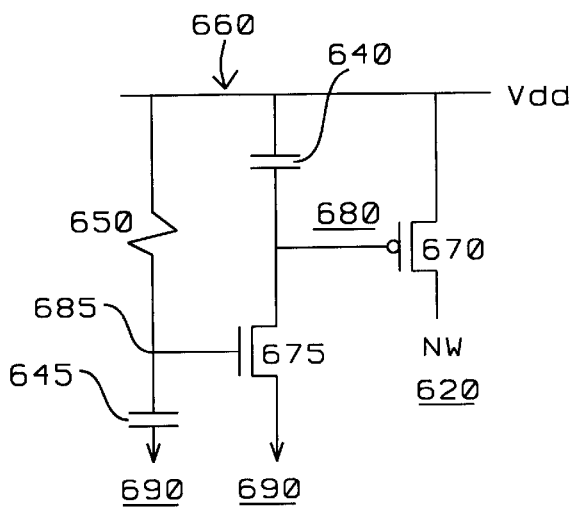
FIG. 6b shows floating well invention variation #2.

FIG. 6b gives the second embodiment of the FWSCR. The FET device 670 has its drain connected to Vdd 660, its source connected to the N-well of the SCR 620, and its gate connected to 680. The capacitor 640 is attached between Vdd 660 and the gate of FET 680. A second FET 675 has its drain attached to node 680, its source attached to ground 690, and its gate attached to 685. The resistor is attached between Vdd 660 and noded 685. A second capacitor 645 is attached between node 685 and ground 690.

Figure 6C:
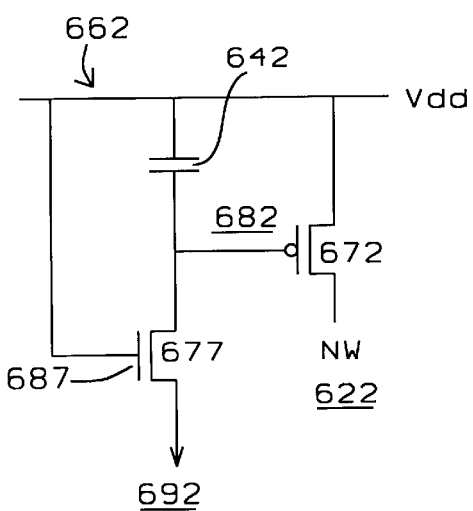
FIG. 6c shows floating well invention variation #3.

FIG. 6c gives the third embodiment of the FWSCR. The FET device 672 has its drain connected to Vdd 662, its source connected to the N-well of the SCR 622, and its gate connected to 682. The capacitor 642 is attached between Vdd 662 and the gate of FET 682. A second FET 677has its drain attached to node 682, its source attached to ground 692, and its gate attached to 682. There is no resistor in this third embodiment. Also, there is no second capacitor in this third embodiment.

This invention has the advantage of better ESD perfomance during ESD events. It also has the advantage of better latch-up immunity during normal operation.

While this invention has been particularly shown and described with Reference to the preferred embodiments thereof, it will be understood by those Skilled in the art that various changes in form and details may be made without Departing from the spirit and scope of this invention.

What is claimed is:

1. A circuit to protect other circuits from Electrostatic Discharge (ESD) damage comprising:

A floating-well circuit connected between a supply voltage Vdd and an N-well of a silicon-controlled rectifier, (SCR), an N+ region imbedded in said N-well and a connection to said N-well via a connection to said N+ region.

2. The floating-well circuit of claim 1 further comprising:

a transistor switch which is turned on during normal operation effectively connecting the N-well of the SCR to the supply voltage (Vdd).

3. The floating-well circuit of claim 1 further comprising:

a transistor switch which is turned on to allow the SCR to provide isolation from ground and circuit protection during ESD events.

4. The floating-well circuit of claim 2 with a turned-on transistor switch effectively connecting the N-well of the SCR to the supply voltage further comprising:

a means to provide latch-up immunity by incorporating a discharge resistor to said circuits.

5. A floating-well circuit comprising:

a capacitor whose one node connected to said supply voltage Vdd and another node connected to one-side of a resistor, and to the gate of a PMOS field effect transistor, said resistor which is connected to said capacitor and to ground, a PMOS field effect transistor (FET) whose gate is attached to said capacitor whose drain is connected to said supply voltage VCC and whose drain is connected to the N-well of the PNPN SCR.

6. The floating-well circuit of claim 5 further comprising:

a means to turn On said p-channel transistor to connect the N-well of the SCR to the supply voltage Vdd.

7. The floating-well circuit of claim 5 further comprising:

a means to turn Off said p-channel transistor in order to bias the SCR to its high impedance state to provide isolation from ground and to provide circuit protection during ESD events.

8. The floating-well circuit of claim 5 further comprising:

a means to provide latch-up immunity by incorporating said discharge resistor to discharge said capacitor of the voltage accumulated by the ESD event.

9. The floating-well circuit of claim 5 further comprising:

a means to allow the turned On p-channel FET to return the SCR to its low impedance state in order to provide latch-up immunity and to return the SCR and the electronic circuits being protected to their normal operation.

10. A floating-well circuit comprising:

a capacitor whose one node connected to said supply voltage Vdd and another node connected to the drain of an NMOS FET, and to the gate of a PMOS field effect transistor, said NMOS FET whose source is connected to ground and its gate is connected to a second capacitor whose other node is connected to ground, said NMOS FET whose gate is also connected to a resistor whose other node is connected to the supply voltage Vdd, said PMOS field effect transistor (FET) whose drain is connected to said supply voltage Vdd and whose source is connected to the N-well of the PNPN SCR.

11. The floating-well circuit of claim 10 further comprising:

a means to turn On said p-channel transistor to connect the N-well of the SCR to the supply voltage Vdd.

12. The floating-well circuit of claim 10 further comprising:

a means to turn Off said p-channel transistor in order to bias the SCR to its high impedance state to provide isolation from ground and to provide circuit protection during ESD events.

13. The floating-well circuit of claim 10 further comprising:

a means to provide latch-up immunity by incorporating said n-channel FET to discharge said capacitor of the voltage accumulated by the ESD event at the gate of the p-channel FET.

14. The floating-well circuit of claim 13 further comprising:

a means to turn On said n-channel FET utilizing said resistor and said second capacitor to charge up the gate voltage of said n-channel FET during a designed time RC constant delay after the occurrence of an ESD event which raised the voltage at the power supply Vdd.

15. The floating-well circuit of claim 10 further comprising:

a means to allow the turned On p-channel FET to return the SCR to its low impedance state in order to provide latch-up immunity and to return the SCR and the electronic circuits being protected to their normal operation.

16. A floating-well circuit comprising:

a capacitor whose one node connected to said supply voltage Vdd and another node connected to the drain of an NMOS FET, and to the gate of a PMOS field effect transistor, said NMOS FET whose source is connected to ground and its gate is connected to the supply voltage Vdd and, said PMOS field effect transistor (FET) whose drain is connected to said supply voltage Vdd and whose source is connected to the N-well of the PNPN SCR.

17. The floating-well circuit of claim 16 further comprising:

a means to turn On said p-channel transistor to connect the N-well of the SCR to the supply voltage Vdd.

18. The floating-well circuit of claim 16 further comprising:

a means to turn Off said p-channel transistor in order to bias the SCR to its high impedance state to provide isolation from ground and to provide circuit protection during ESD events.

19. The floating-well circuit of claim 16 further comprising:

a means to provide latch-up immunity by incorporating said discharge n-channel FET to discharge said capacitor of the voltage accumulated by the ESD event.

20. The floating-well circuit of claim 19 further comprising:

a means to turn On said n-channel FET utilizing the power supply voltage Vdd to charge up the gate voltage of said n-channel FET during a designed time RC constant delay after the occurrence of an ESD event which raised the voltage at the power supply Vdd.

21. The floating-well circuit of claim 16 further comprising:

a means to allow the turned On p-channel FET to return the SCR to its low impedance state in order to provide latch-up immunity and to return the SCR and the electronic circuits being protected to their normal operation.

22. A method of protecting circuits from electrostatic discharge ESD damage comprising the steps of:

connecting a floating-well circuit between the power supply voltage Vdd and the N-well of an SCR;

imbedding an N+ region in said N-well, and connecting to said N-well via a connection to said N+ region.

23. The method of protecting circuits from ESD damage of claim 22 and further comprising the steps of:

switching an FET On during normal operation to effectively connect the N-well of the SCR to the supply voltage Vdd, switching of an FET Off during ESD events which allows the SCR to provide effective isolation from ground and protection of circuits, providing latch-up immunity for the SCR via a discharge resistor attached to the said capacitor.

24. A simulation model of an ESD protection circuit comprising:

a simulation model of a PNPN SCR, a floating well circuit inserted between the power supply voltage Vdd and the N-well of an SCR wherein said floating well circuit comprises a capacitor whose one node connected to a supply voltage Vdd and another node connected to one side of a resistor, and to a sate of a PMOS field effect transistor said resistor which is connected to said capacitor and to around, and a PMOS field effect transistor (FET) whose gate is attached to said capacitor whose drain is connected to a supply voltage VCC and whose drain is connected to the N-well of said PNPN SCR.

25. The simulation model of claim 24 further comprising:

a floating well (FW) circuit with an FET capacitor and a resistor.

26. The simulation model of claim 24 further comprising:

a FW circuit with a PMOS FET, an NMOS FET, two capacitors, and one resistor wherein said floating well circuit comprises a capacitor whose one node connected to a supply voltage Vdd and another node connected to a drain of an NMOS FET and to a gate of a PMOS field effect transistor, said NMOS FET whose source is connected to ground and its gate is connected to a second capacitor whose other node is connected to ground, said NMOS FET whose gate is also connected to a resistor whose other node is connected to a supply voltage Vdd and said PMOS field effect transistor (FET) whose drain is connected to said supply voltage Vdd and whose source is connected to the N-well of said PNPN SCR.

27. The simulation model of claim 24 further comprising:

a FW circuit with a PMOS FET, an NMOS FET and a capacitor wherein said floating well circuit comprises a capacitor whose one node connected to said supply voltage Vdd and another node connected to a drain of an NMOS FET, and to a gate of a PMOS field effect transistor, said NMOS FET whose source is connected to ground and its gate is connected to said supply voltag Vdd and said PMOS field effect transistor (FET) whose drain is connected to said supply voltage Vdd and whose source is connected to the N-well of the PNPN SCR.

* * * * *